US00RE38053E

(19) United States
(12) Reissued Patent
Kanezawa

(10) Patent Number: US RE38,053 E
(45) Date of Reissued Patent: Apr. 1, 2003

(54) LIQUID CRYSTAL DISPLAY DEVICE AND MANUFACTURING METHOD THEREOF

(75) Inventor: Tatsuo Kanezawa, Suwa (JP)

(73) Assignee: Seiko Epson Corporation, Tokyo (JP)

(21) Appl. No.: 09/801,172

(22) Filed: Mar. 5, 2001

Related U.S. Patent Documents

Reissue of:
(64) Patent No.: 5,657,104
Issued: Aug. 12, 1997
Appl. No.: 08/584,508
Filed: Jan. 11, 1996

(30) Foreign Application Priority Data

Jan. 13, 1995 (JP) ..... 7-004483
Nov. 16, 1995 (JP) ..... 7-298276

(51) Int. Cl.[7] ..... G02F 1/1345
(52) U.S. Cl. ..... 349/149; 349/152; 359/88; 427/96
(58) Field of Search ..... 349/149–152; 427/96

(56) References Cited

U.S. PATENT DOCUMENTS 4,466,701 A * 8/1984 Ogata et al.
4,631,952 A * 12/1986 Donaghey ..... 73/23
4,930,876 A * 6/1990 Suzuki et al. ..... 359/88
5,042,919 A * 8/1991 Yabu et al. ..... 359/88
5,067,796 A * 11/1991 Suzuki et al. ..... 359/88
5,100,695 A * 3/1992 Kawakami et al. ..... 427/96
5,187,604 A * 2/1993 Taniguchi et al. ..... 359/88
5,317,438 A * 5/1994 Suzuki et al. ..... 359/88
5,406,164 A * 4/1995 Okawa et al. ..... 310/88
5,467,210 A * 11/1995 Kishigami ..... 359/88

* cited by examiner

*Primary Examiner*—William L. Sikes
*Assistant Examiner*—Julie Ngo
(74) *Attorney, Agent, or Firm*—Michael T. Gabrik

(57) ABSTRACT

A liquid crystal display device is provided having a plurality of electrodes in electrical communication with a conduction portion of a plurality of external wirings. An external portion is in electrical communication with the plurality of electrodes and comprises a conduction layer having a predetermined thickness, the conduction layer being arranged in a predetermined pattern on the external portion and between the external wirings and the external portion.

13 Claims, 6 Drawing Sheets

LIQUID CRYSTAL DISPLAY DEVICE AND MANUFACTURING METHOD THEREOF

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to a liquid crystal display device and method of manufacturing it, and more particularly, relates to a structure of a connection portion existing between a liquid crystal panel and a flexible substrate.

2. Description of the Related Art

There are various kinds of conventional liquid crystal display devices. In conventional liquid crystal display devices, by sealing a liquid crystal layer between two transparent substrates, and applying a voltage between the electrodes having fixed pattern formed inside of the substrates, it is possible to display various images.

In many cases, conventional liquid crystal display have a flexible substrate (referred to as an FPC hereinafter) to connect the liquid crystal display panel to control and drive circuits located outside of the liquid crystal display device. An example of the liquid crystal display device is described in the Utility Model (examined) Publication Hei 5-18789, (Japanese Utility Model (unexamined) Publication Hei 2-87473).

The connection portions have a predetermined pitch (namely the space as between adjacent wirings) adapted to the pitch of the external terminals, and the external terminals of the liquid crystal display device and the connection portions of the FPC are electrically connected to each other.

There are several methods to connect the FPC to the external terminals. One is to put the external terminals and other is to place an anisotropic conductive film between the external terminals and the connection portions, then adhering them by applying heat and pressure.

In the latter method (heat seal method), the anisotropic conductive film is formed on the surface of the connection portion of the flexible substrate, and conductive particles are arranged at equal interval which are made of a couple of $\mu$m fine metal particles, then so plating the connection portion of the flexible substrate so as to contact to the external terminals. These heated components are pressed together so that the anisotropic conductive film is crushed and the external terminals and the connection portions are electrically connected to each other through the conductive particles. As mentioned above, the FPC is adhered to the liquid crystal panel easily by means of the anisotropic conductive film.

FIGS. 7, 8, 9, and 10 show an example of conventional technology using the heat seal method. FIG. 7 is a perspective view showing a connection area for connecting the FPC to the liquid crystal display panel, and FIG. 8 shows an enlarged cross-sectional view of an edge area of the liquid crystal display device. Typically transparent electrodes 3 are formed inside of a top substrate 1, and transparent electrodes 4 are also formed inside of a bottom substrate. 2. A liquid crystal layer 5 which is shown in FIG. 8 is sealed between top substrate 1 and bottom substrate 2, and a display area D is formed on the top substrate 1 as shown in FIG. 7. The bottom substrate extends outward beyond in comparison with the edge area of transparent substrate 1, and this extended portion forms an electrode lead-out area 2a. External terminals 3a, 4a are respectively connected to transparent electrodes 3, 4, which are transparent, formed in the shape of stripes and are arranged in parallel on the electrode lead-out area 2a.

On the other hand, in a resin sheet of a FPC 10, a plurality of conductive lines 12 are arranged almost in parallel, and the back side of the edge area of the conductive line 12 is exposed at a connection portion 10a of FPC 10. Connection portion 10a of FPC 10 is placed on the electrode lead-out area 2a as mentioned above and then heated and crimped. It is secured by the adhesive property of the anisotropic conductive film. As mentioned above, the external terminals 3a, 4a and the conductive lines 12 are electrically connected each other.

FIG. 9 depicts a printed circuit board 30 on which a liquid crystal drive circuit is mounted and connected to the liquid crystal display device through FPC 10. The back side of the conductive lines 12 are also exposed at a connection portion 10b on a circuit board 30, and the exposed area is also covered by the anisotropic conductive film. In the same way of above case, the connection portion 10b is secured to the printing circuit board 30, and the edge area of the conductive line 12 is conductivity connected to connection pads 31.

Conventional liquid crystal display devices have a number of disadvantages and problems as described below.

In the above mentioned conventional liquid crystal display device, when there is a transformation of the FPC, the stress caused by flexibility of the FPC may be applied to the conductive connection portion which is between the external terminals and connection portion. As a result wires may be cut, separated, or cause an interruption in the circuit. Therefore, reliability of such electrical connections of the conductive connection portion is reduced.

Particularly, in the above mentioned case, the thickness of the conductive layer on external terminals 3a, 4a is between 200 Å and 600 Å. This is a result of a process which the liquid crystal display device is manufactured, and this is much thinner than the thickness between 10 $\mu$m or 40 $\mu$m which is the thickness of the connection pads 30 formed on a printing circuit board 31. Therefore, in the case of crimping the anisotropic conductive film, the space between the FPC and peripheral portion of the external terminals is narrow, so the space where extra adhesive or/and conductive particles can escape is also narrow. Consequently, the contact area with the conductive particles in the anisotropic conductive film becomes much smaller than the connection portion of the connection pads 31. As a result of this configuration, the resistance of the connection portion tends to increase, and the risk of a break in the circuit also increases. To improve this point, there may be a way to form the anisotropic conductive film of connection portion 10a so as to be thinner than connection portion 10b an so on. However, in this way, it is difficult to maintain the quality of the connection portion, and there is a problem that the cost for manufacturing FPC 10 increase, therefore, the problem can not be solved in the above way.

In addition, in so called heat seal method for connecting the FPC through the anisotropic conductive film, although it is an easier operation for connecting, there is a problem, however, that due to the temperature, the conductive particles float in the anisotropic conductive film. This results in the conductive particles being separated from upper surface of the external terminals, and the conductive connection between them are then easily broken.

Finally, in conventional devices, there is a tendency during the manufacturing process not to have a perfect alignment of arranging conductive line 12 on external terminal 4a. FIG. 10 is an exploded view of a single connection of line 12 on external terminal 4a. As shown therein, conductive line 12 is misaligned on external terminal 4a by an amount δ. This results in a smaller area of electrical contact, thus making a poorer contact having a high resistivity.

With the advent, in recent years, of large capacity size of liquid crystal display devices, and the number of the external terminals has increased accordingly, thus resulting in the pitch between terminals being very fine (which is a particular with requirement of small-sized devices). As such there has been an increase in defective products.

OBJECTS OF THE INVENTION

Therefore, it is an object of the present invention to overcome the aforementioned problems.

It is another object of the present invention to improve the reliability of electrical conductive connection between a liquid crystal panel and an FPC without increasing of cost for manufacturing.

It is a further object of this invention is to reduce the cost of liquid crystal display device and products using it, and to improve the durability of these products by improving the reliability of the electrically conductive connection portion and the registration rate of such products.

SUMMARY OF THE INVENTION

In accordance with an aspect of the present invention a liquid crystal display device is provided with a liquid crystal panel having a liquid crystal layer sealed between two substrates and an external terminal electrically connected to an electrode used for applying an electrical field to the liquid crystal layer. A flexible substrate includes a connection portion electrically connected to the external terminal, and a conductive layer having a fixed thickness is provided in a predetermined pattern between the external terminal and the connection portion.

In accordance with another aspect of the present invention a conductive layer having a fixed thickness is provided in a predetermined pattern between the external terminal, and the connection portion. Pressure supplied from outside is transmitted intensively to the portion between the external terminals and connection portions, and sufficient pressure is supplied to the portion between external terminal and connection portion. As a connection area formed by the thickness of conductive layer is attached to the connection portion, a contact area of a conductive adhesive provided between the external terminals and the connection portion is broaden. This results in maintaining a predetermined conductivity. As a result, the occurrence of conductive deterioration caused by stress or heat from outside is reduced. This is especially true in the case when the external terminals and the connection portion are electrically connected by sufficient pressure, when the flexible substrate is transformed along to the plane of by the conductive layer, and when contact pressure and the contact area is increased.

In this case, the conductive layer should preferably be formed on a surface of the external terminal by arranging a stiffened conductive paste in a predetermined pattern. In this way, it is easier to form the conductive layer.

The conductive paste should preferably be a conductive ink and the conductive layer should preferably be formed by printing. As such, the conductive layer can be formed in low cost.

Additionally, the conductive paste should preferably be formed using a carbon particle and a phenol resin as the main ingredient. In this case, electrical conductivity is sufficient, and making it possible to provide the conductive layer having certain conductivity without losing the conductive layer's shape. This results since the conductive layer is stiffened by heating concurrently with connection.

Furthermore, the upper side of the conductive layer should preferably be formed having a toughened or irregularly shaped surface. As such, a conductive contact area is broaden and the adhesion force become stronger.

Additionally, an adhesive layer should preferably include conductive particles, which contact with the conductive layer, is formed between the external terminal and the connection portion. An anisotropic conductivity can be obtained, and as the conductive particles in the adhesive comes in contact with the conductive layer, large contact area and large compression force are obtained. In accordance with this arrangement, and durability of the contact area for the stress and heat from out side are improved.

Furthermore, the conductive layer should preferably consist of same material with a conductive connection portion for connecting the electrode of the liquid crystal panel and the external terminal. As such, the effect as mentioned above is obtained without adding other fabrication steps.

In a method of manufacturing a liquid crystal display devices of the invention, a conductive layer is formed in a predetermined pattern on a surface of an external terminal conductivity connected to an electrode for applying an electric field to a liquid crystal layer contained between two substrates of a liquid crystal panel, and a connection portion of a flexible substrate is electrically connected to the external terminal through the conductive layer. Especially, as the conductive layer is formed in a predetermined pattern on the external terminal at the same time of forming with the same material as a conductive connection portion for connecting the electrode and the external terminals conductivity, it is not necessary to add further fabrication steps. The liquid crystal display device equipped with this reliable connection portion between a liquid crystal panel and a flexible substrate can be obtained easily and at a low cost.

Additionally, it is preferable that the conductive layer is contacted once to both of the two substrate, then eliminating a part of one of the substrates which contacts to the conductive layer, so that upper surface of the conductive layer which remains on other the substrate is formed roughened or irregular surface. In this way, when a substrate is removed, upper portion of the conductive layer is separated with the substrate which is removed, therefore, it is possible to form the toughened surface of upper side of the conductive layer which remains. As a result, this arrangement of the adhesion force is improved and the contact area is increased.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 1:
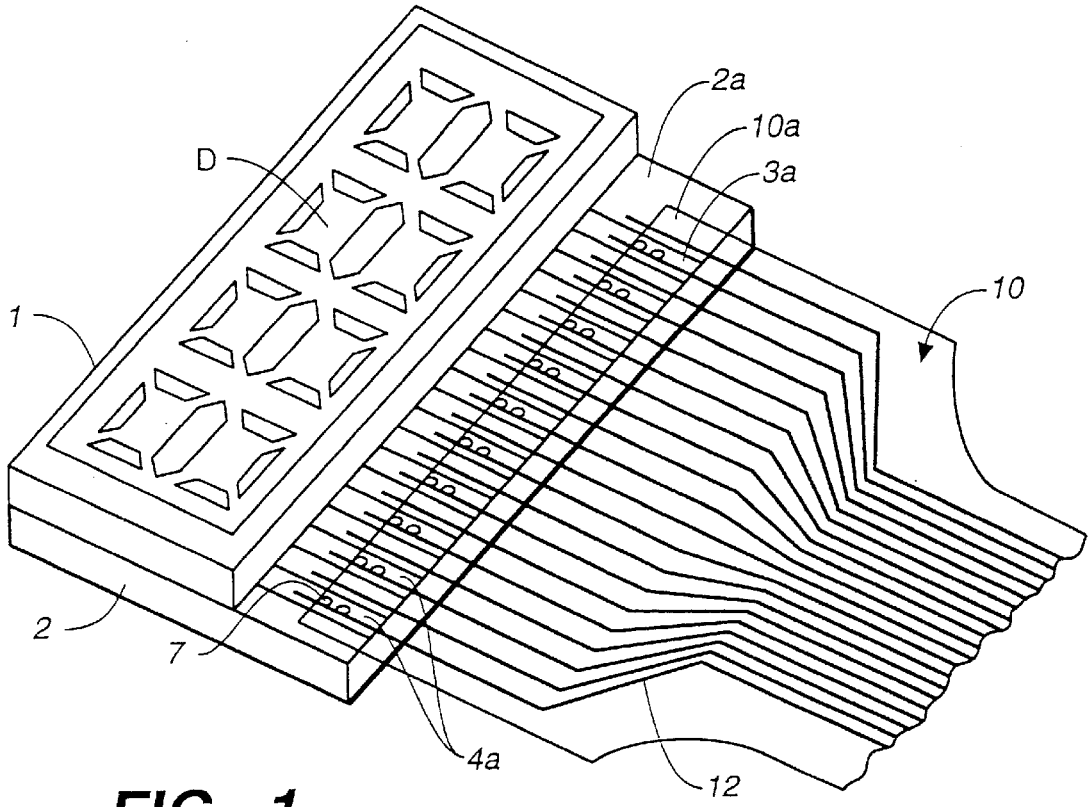
FIG. 1 a perspective view of a liquid crystal display device in accordance with an embodiment of the present invention.
Figure 2:
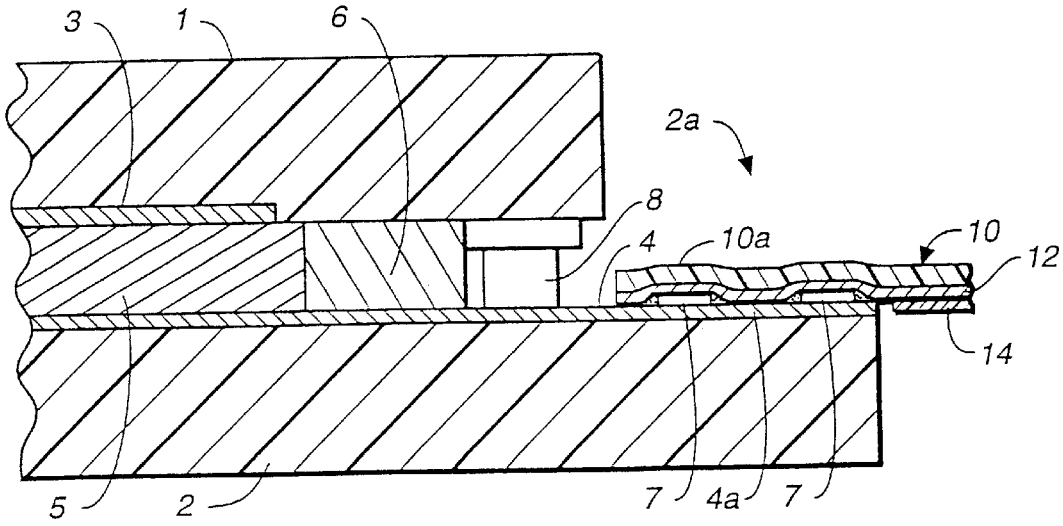
FIG. 2 is an cross-sectional view showing a connection portion of a liquid crystal panel and a flexible substrate (FPC) of the embodiment of FIG. 1.

Next, the embodiments of the invention will be explained with references to the drawings. Referring to FIGS. 1 and 2 the liquid crystal display device of this embodiment is provided with top substrate 1 and bottom substrate 2 made of glass or a transparent resin substrate. Electrodes 3, 4 which are preferably transparent, are formed in a striped shape of an inner surface of the top substrate 1 and an inner surface bottom substrate 2. A liquid crystal layer 5 is then sealed between the top substrate 1 and bottom substrate 2 by seal material 6. A display area D is formed at an outer portion of top substrate 1 corresponding to the liquid crystal layer 5. A refractor (not shown) may be provided on the outer portion of bottom substrate 2. Turning to FIG. 2, bottom substrate 2 extends outwardly beyond substrate 1, forming an exposed electrode lead-out area 2a, on the inner surface of bottom substrate 2. Further, polarization plates (not shown) may be placed on the outer surface of top substrate 1 and the outer surface of bottom substrate 2, in the case of TN (Twisted Nematic) or STN (Super Twisted Nematic) type liquid crystal display devices.

A plurality of external terminals 3a, 4a are aligned and formed on a surface of electrode lead-out area 2a. External terminals 3a, 4a are arranged at predetermined internals in a stripe shape. The external terminals 3a are electrically connected to transparent electrodes 3 via conductive connector portion 8 which are formed on the inner surface of substrate 1, and external terminals 4a are electrically connected to transparent electrodes 4 which are formed on the inner surface of substrate 2. On a surface of the electrode lead-out area 2a, a connection portion 10a of flexible substrate 10 (FPC) is aligned and secured to the position where the external terminals 3a, 4a are formed.

Figure 2A:
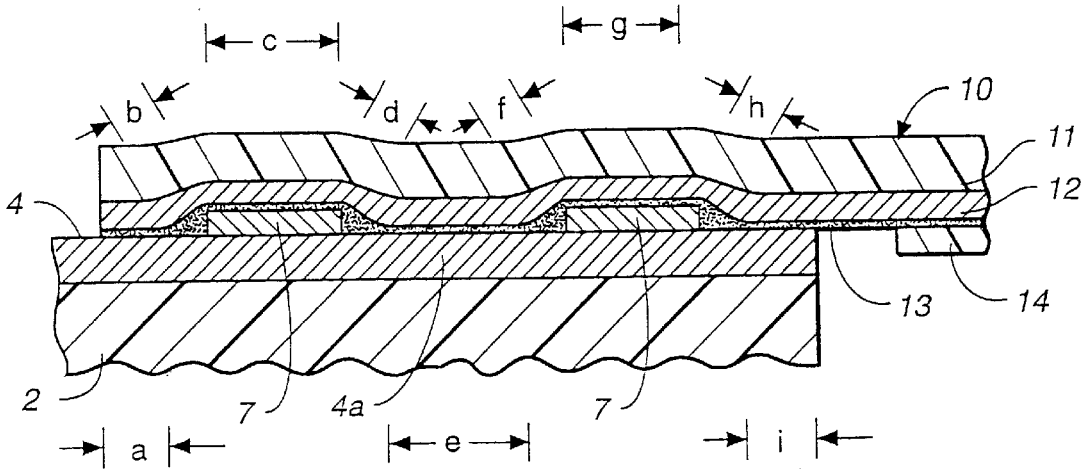
FIG. 2A is an exploded view of the connection area of FIG. 2.
Figure 3:
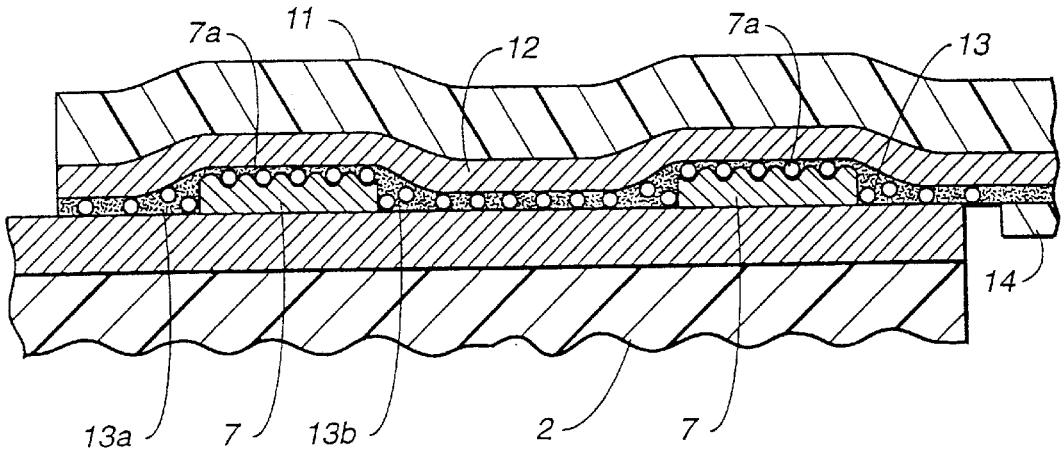
FIG. 3 is an enlarged cross-sectional view showing the external terminals secured to the FPC of FIG. 1.
Figure 4:
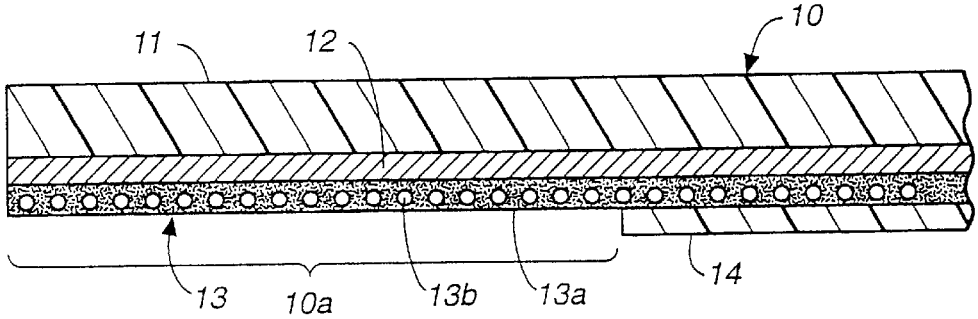
FIG. 4 is an enlarged cross-sectional showing the structure of the FPC.

Referring specifically to FIG. 2A, FPC 10 is provided with a resin sheet 11 which is transparent, and conductive lines 12 made of carbon layer formed on the inner of surface resin sheet 11, (conductive lines 12) are preferably being arranged in parallel. Referring to FIGS. 3 and 4, FPC 10 further comprises an anisotropic conductive film 13 and a coat layer 14 for covering a portion other than the connection portion 10a. Anisotropic conductive film 13 is provided with adhesive materials made of preferably a thermoplastic resin having conductive particles 13b. Conductive particles 13b consist of small carbon particles or metallic particles which are arranged in at predetermined intervals.

As shown in FIGS. 1 and 2, on external terminals 3a, 4a which arranged on a surface electrode lead-out area 2a, two circular shaped conductive layers 7 are aligned in the direction where external terminals 3a, 4a are extended on electrode lead-out area 2a. External terminals 3a, 4a and conductive lines 12 are electrically connected through the anisotropic conductive film 13 sandwiching the conductive layer 7.

Conductive lines 12 are secured to external terminals 3a, 4a as follows. The adhesive material of anisotropic film 13 is melted by applying heat and applying pressure on conductive lines 12 and external terminals 3a, 4a. After anisotropic film 13 has solidified conductive layer 7 is thus secured to conductive line 12, provided secure mechanical and electrical connections.

Figure 5:
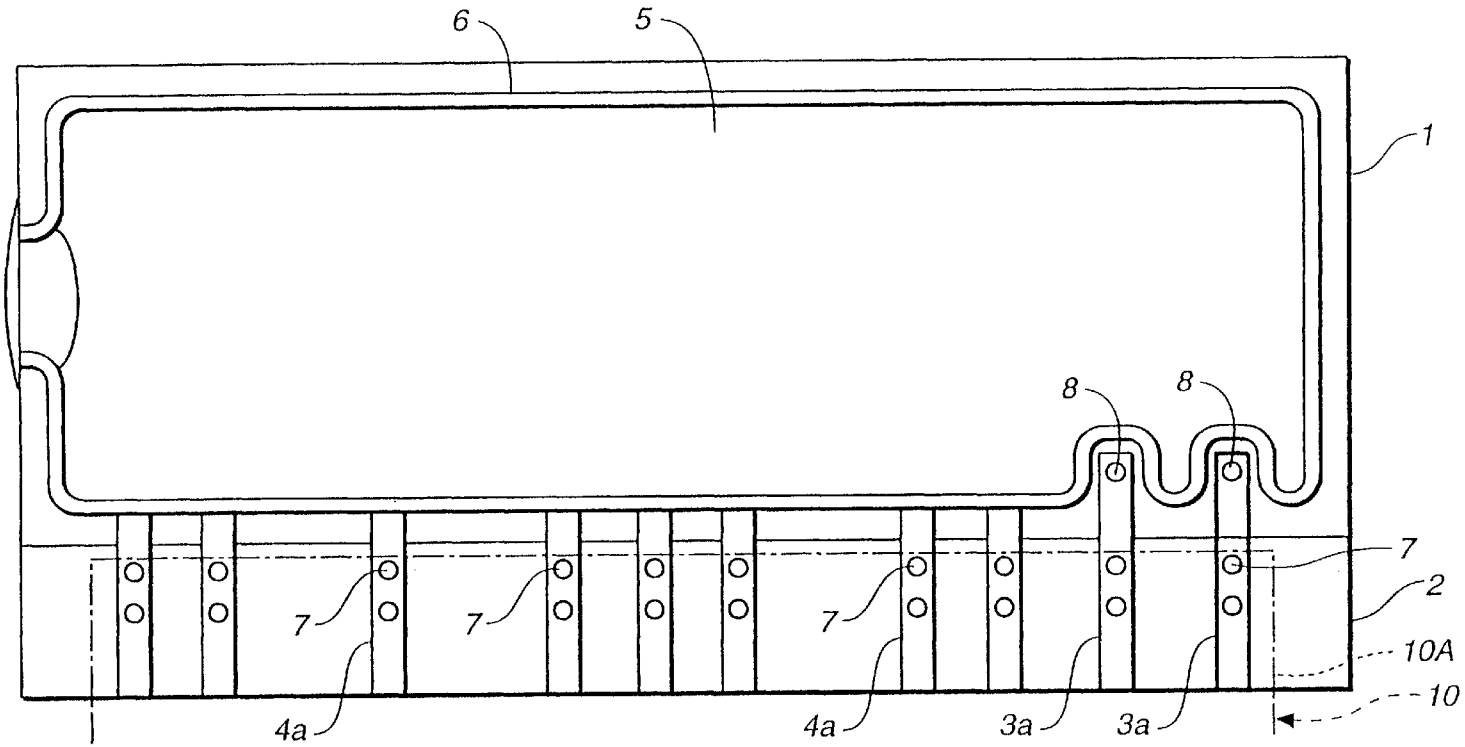
FIG. 5 is a top view for showing the structure of the liquid crystal display device of the embodiment of the present invention.
Figure 9:
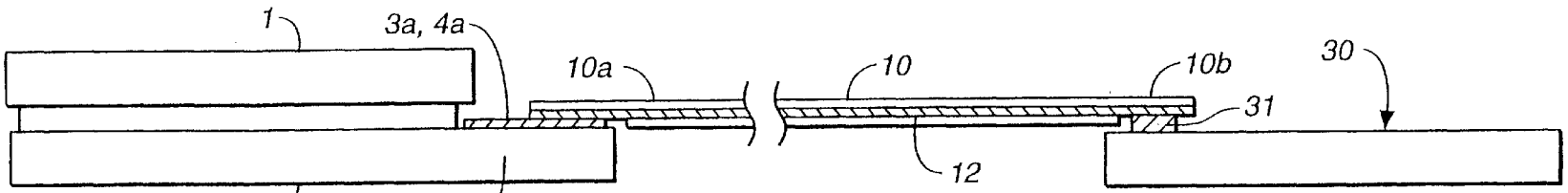
FIG. 9 (PRIOR ART)
FIG. 9 is another cross-sectional view of the conventional liquid crystal display device.

FIG. 5 is a top perspective view of the present embodiment. External terminals 3a are electrically connected to transparent electrodes 3 (FIG. 2) through conductive connection portion 8 formed by same material of conductive layer 7. Further, external terminals 4a are electrically connected to transparent electrodes 4 (FIG. 2) formed on the surface of bottom substrate 2. The number and arrangement of external terminals 3a and 4a are defined according to the pattern of transparent electrodes 3, 4 formed on top and bottom sides of liquid crystal layer 5. Conductive layer 7 is formed in a predetermined pattern on external lead-out area 2a.

Figure 6A:
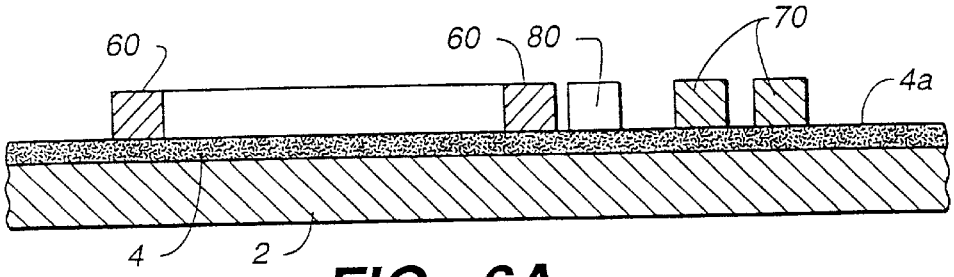
FIGS. 6A–6D are diagrams showing the process of forming the liquid crystal display device in accordance with the present invention.

FIGS. 6A–6D show a process of fabricating the liquid crystal display device in accordance with the present invention. As shown in FIG. 6A, external terminals 3a, 4a and transparent electrode 4 are formed in a predetermined pattern on a surface of bottom substrate 2. Seal material 60 is secured and arranged surrounding the display area. Further, conductive connection pattern 80 to electrically connect top and bottom substrates is formed on external terminals 3a, and a conductive layer pattern 70 is formed on external terminals 3a and 4a by, for example, screen printing using conductive ink. Such conductive ink typically comprises carbon particles dispersed in a phenol resin. The shape of conductive layer pattern 70 is a column having a diameter between 0.2 mm and 0.5 mm, which is approximately same as width of the external terminal 3a, 4a and having a thickness of approximately 30 mm.

Figure 6B:
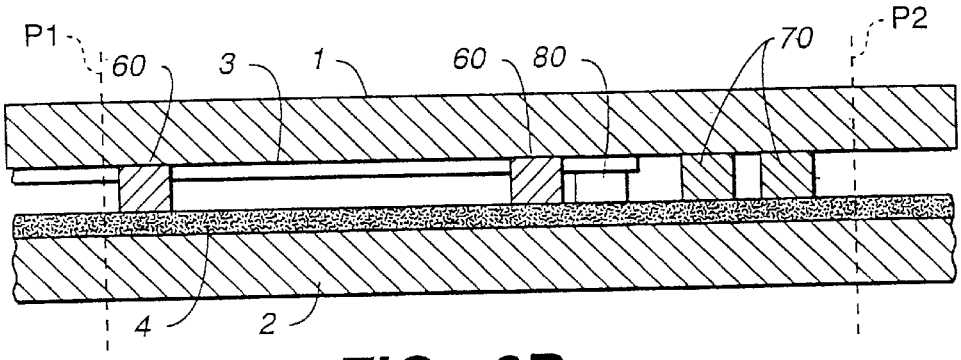

Next, as shown in FIG. 6B, transparent electrode 3 having a predetermined pattern is formed on top substrate 1. Then seal material 60, conductive layer pattern 70 and connection pattern 80, for connecting transparent electrodes 3 and to external electrodes 3a are secured on the inner surface of top substrate 1. Substrate 1 and substrate 2 are secured by heating at the temperature range of 150° C. to 200° C., and adhering seal material 60, conductive layer pattern 70 and conductive connection pattern 80 between the inner surface of top substrate 1 and the inner surface of bottom substrate 2. Thereafter seal material 60 is completely hardened for forming seal portion 6. Top substrate 1 and bottom substrate 2 are secured to each of them by seal portion 6, and conductive layer pattern 70 and conductive connection pattern 80 are secured to the inner surface of top substrate 1 and the inner surface of bottom substrate 2. It is noted that contact portion between substrates 1 and 2 is stiffened periodically. The characteristic of stiffness of conductive layer pattern 70 and conductive connection pattern 80 can be regulated by selecting suitable materials or adding additional stiffening agents, such as a polymerization inhibitor to vary the stiffness characteristics of seal material 60.

Figure 6C:
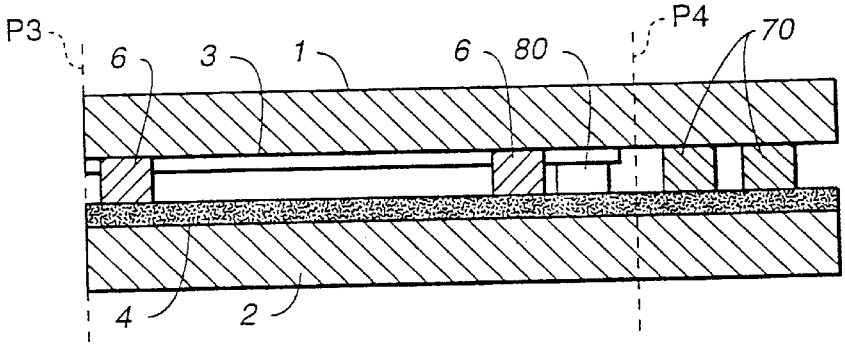
Figure 6D:
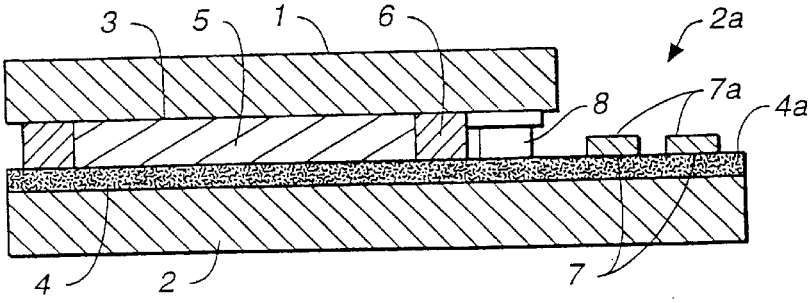
Figure 7:
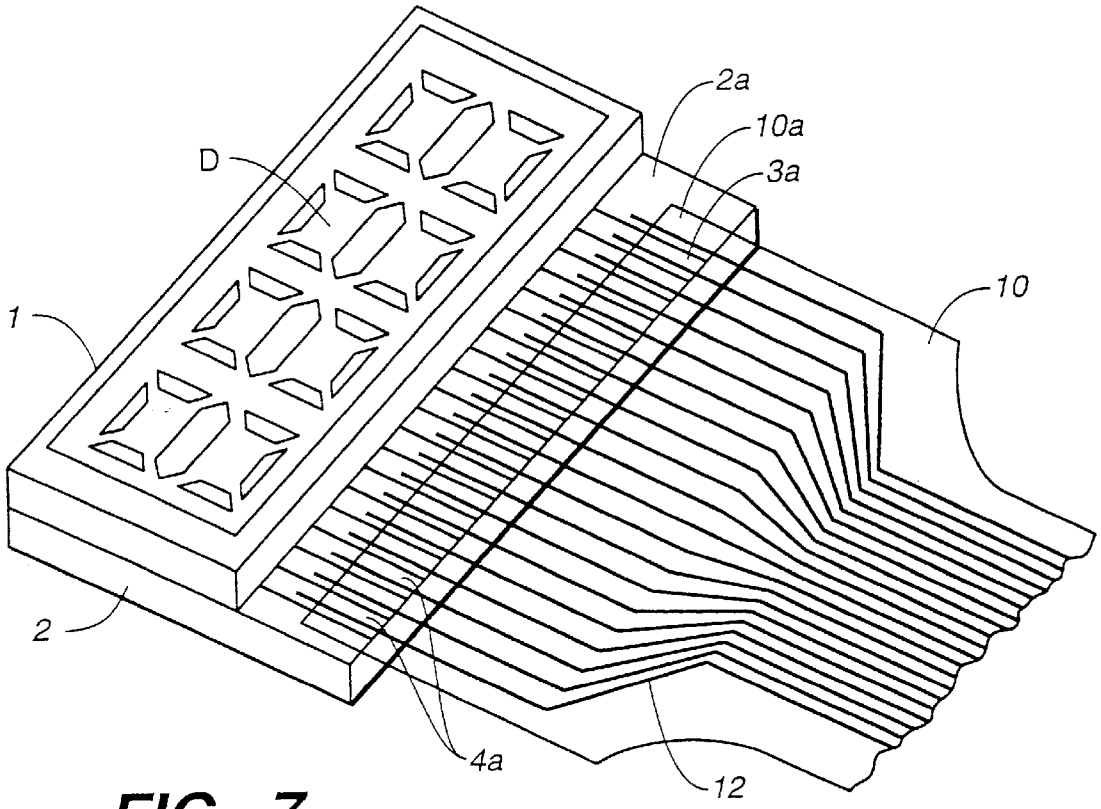
FIG. 7 (PRIOR ART)
FIG. 7 is atop perspective view showing a conventional liquid crystal display device.

Referring to FIG. 6B, top substrate 1 and bottom substrate 2 are cut into individual liquid crystal panels, along lines P1 and P2. Additionally, as shown in FIGS. 6C and 6D, a portion of top substrate 1 is eliminated to form electrode lead-out area 2a along line P4. Conductive layer pattern 70 is divided near the middle of the conductive layer 7 when eliminating the part of top substrate 1. Conductive layer 7 is formed having a roughened or irregular upper surface 7a. In the preferred embodiment, the thickness of conductive layer 7 is approximately between 10 $\mu$m and 20 $\mu$m. Finally, the device is trimmed along line P3.

As noted above liquid crystal layer 5 is formed by sealing liquid crystal inside of seal portion 6 and securing the FPC 10 shown in FIG. 4 on electrode lead-out area 2a. Conductive layer 12 of FPC 10 is arranged on electrode lead-out area 2a in electrical connection with corresponding external terminals 3a, 4a. FPC 10 is preferably connected to the liquid crystal panel by heat sealing using a heat crimping tool for applying heat and pressure.

The conditions of this heat sealing process is, in general, at a temperature range between 130° C. and 150° C. at the surface of pressing side, having a pressure range between 20 kg/cm$^3$ and 30 kg/cm$^3$, and for a time between 5 sec. and 10 sec. It is very important to control the above-discussed conditions, since these conditions can contribute to the reliability of the connection between the liquid crystal panel and FPC 10.

Turning again to FIG. 4, in the case that conductive layer 7 is not formed as in the conventional devices, when the temperature, pressure, and time are lower than the preferred range for heat sealing as mentioned above, the adhesion force tends to deteriorate because of inadequate fusion of the adhesive material 13a. Moreover, when the temperature, pressing force and the time are higher than the range of the conditions for heat sealing mentioned above, there is also a tendency of poor connections because conductive particles 13b float in the adhesive material 13a without making adequate contact, by the heating of the anisotropic film 13.

In the present embodiment, it is also preferable for heat sealing in the range of the condition between 100° C. to 180° C., at the pressure between 15 kg/cm$^3$ to 50 kg/cm$^3$, and at a time between 5 sec. to 10 sec, it would be possible to manufacture the device without causing any problems conductive connection portion.

A liquid crystal display devices constructed in accordance with the present invention having a pitch for the external terminals 3a, 4a between 0.8 mm and 0.4 mm is reliable and does not exhibit the disadvantages and draw-backs of conventional liquid crystal displays.

A liquid crystal display that is heat sealed as mentioned above, adhesive materials 13a of the anisotropic conductive film are melted once, then hardened such that both of conductive line 12 and external terminals 3a, 4a are in contact with conductive particles 13b. At this time, upper surface of the conductive layer 7 formed on the external terminals 3a, 4a form an electrode lead-out area 2a so that the upper surface of conductive layer 7 and conductive lines 12 are secured as shown in FIG. 3 to provide a reliable electrically conductive connection. Also, according to the present invention there is an advantage that the contact area with conductive particles in the anisotropic conductive film can be widened, to a space where the anisotropic conductive film can be released and secured by the thickness of the conductive layer 7 as compared to. However, at this time, because of over heating of heat seal 6, conductive layer 7 is hardened for securing its shape and therefore, conductive layer 7 does not lose its shape.

Figure 10A:
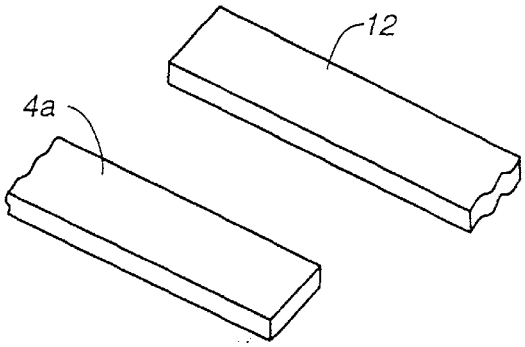
FIG. 10A (PRIOR ART)
FIGS. 10A and B are exploded perspective views of an external terminal and a conductive line in accordance with the conventional liquid crystal display.
Figure 11A:
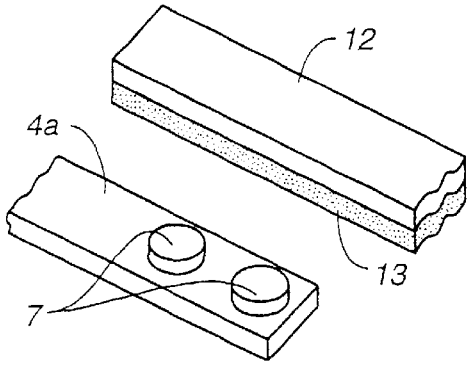
FIGS. 11A and B are exploded perspective views of an external terminal and a conductive line in accordance with the embodiment of FIG. 1.
Figure 10B:
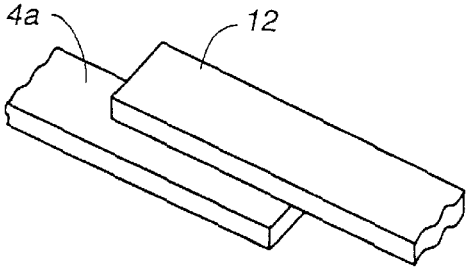
FIG. 10B (PRIOR ART)
Figure 11B:
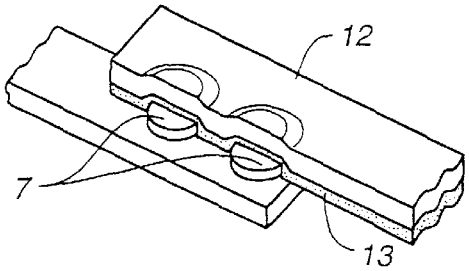
Figure 12:
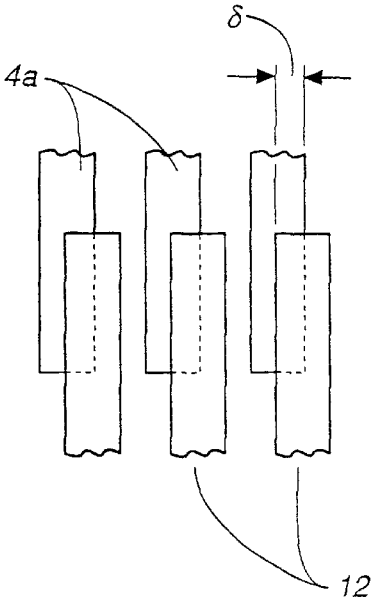
FIG. 12 is a plan view of FIG. 10B.
Figure 13:
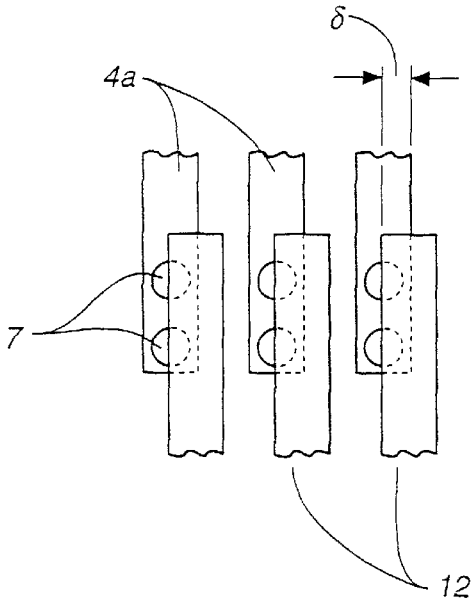
FIG. 13 is a plan view of FIG. 11B.

In general, external terminals 3a, 4a are made of thin metal film, however, electrode lead-out area 2a are formed having a thickness approximately between 2000 Å to 3000 Å. As noted above in conventional devices due to misalignment during the manufacturing process if any, there is length $\delta$ of conductive line 12 that is not in contact with external terminal 4a, as shown in FIGS. 10A and B and 12. This results in a connection that has a high resistivity and is less mechanically secured. However, in the present embodiment, as shown in FIGS. 11A and B and 13, if there is any misalignment of the conductive line 12 with the external terminal 3a, the portion of conductive line 12 would be in contact with a side wall of conductive layer 7. This arrangement provides for a good electrical having a lower resistivity than conventional devices. Moreover, there is increased mechanical strength. As presently preferred, the thickness of conductive layer 7 is in the range of 10 $\mu$m to 20 $\mu$m even the case which the electrode lead-out area 2a is rather thick.

Figure 8:
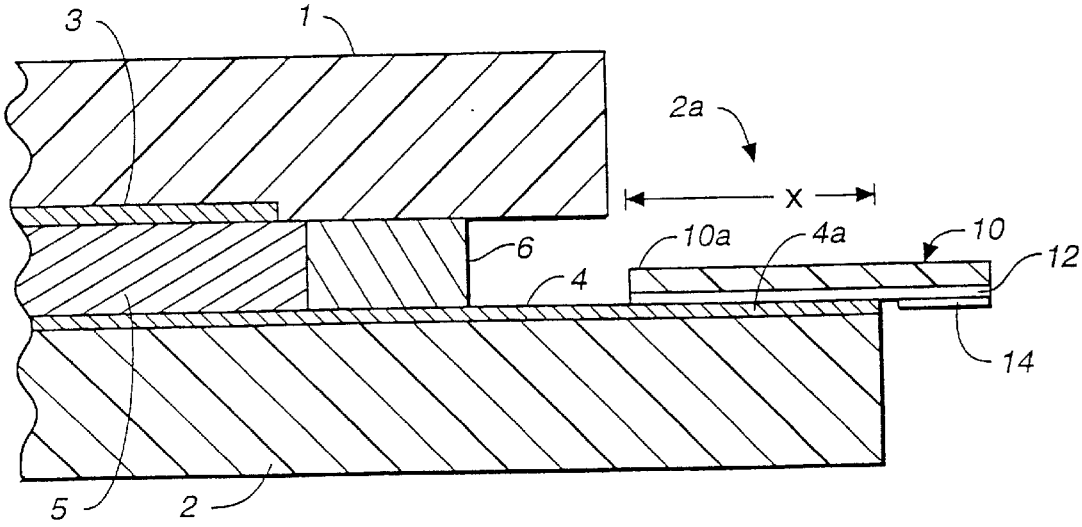
FIG. 8 (PRIOR ART)
FIG. 8 is a cross-sectional view showing a connection portion of a liquid crystal panel and a FPC of the conventional liquid crystal display device.

In conventional devices a length x of conductive line 12 is in contact with external terminal 4a as shown in FIG. 8. This length x corresponds to a certain resistivity. Now referring to FIG. 2A; the length of contact of conductive line 12 is in the sum of the contact area a+b+c+d+e+f+g+h+i which is greater than length x of the conventional device. By virtue of this feature, resistivity is reduced and mechanical strength is increased.

Additionally, as upper surface 7a of the conductive layer 7 is formed having a roughened surface, thus, adhesion force between the upper surface 7a of the conductive layer 7 and the anisotropic film 13 is improved. As conductive particles 13b are rigidly connected to upper surface 7a, positive electrical connection is achieved. In accordance with this structure, durability and heat resistance of the device are improved.

In the preferred embodiment, the liquid crystal panel and FPC are adhered by hot adhesion through the anisotropic film 13. However, as long as there is a face to face connection, other techniques such as welding by pasting conductive paste, solder, reflow, or the like or can obtained similar advantages.

Further, FC 10 is not limited to an FPC having only wiring, various kinds of the FPC can be employed, such as FPC mounting semiconductor devices and the like.

In this embodiment, carbon lines forming conductive layer 7, conductive connection portion 8 which are made of the same material with conductive ink are formed, adhesion and conductivity between the FPC and the conductive layer formed on the external terminals are thus excellent. By using carbon particles as conductive particles aligned in the anisotropic conductive film, further improvement of conductivity can be achieved.

As mentioned above, as conductive layer 7 is formed at the same time and of the same material, it is possible to form the layer without changing the manufacturing process or adding steps. However, needless to say, the conductive layer 7 can be formed in a separate process after forming the electrode lead-out area 2a.

The conductive layer can not only have a circular shape but can be formed in other shapes such as a rectangle. It is preferable to form the conductive layer in circle or in dotted shape having substantially the same width with the external terminals are aligned along to the direction of the external terminals.

As explained above, the invention provides the following effects.

According to an aspect of the present invention, as a conductive layer having a fixed thickness and partially formed between the external terminal and the connection portion, external pressure supplied is transmitted intensively to the portion between external terminals and connection portions, and sufficient pressure is supplied to the portion between externals terminal and connection portion, and as the connection formed by the thickness of conductive layer is attached to the portion. The contact area of conductive adhesive formed between the external terminals and connection portion are broaden and the good electrical conductivity is kept and maintained. As a result of it, the occurrence of poor conductivity caused by suffering stress or heat from out side is reduced. A device constructed in accordance with the present invention provides a secure mechanical and electrical connection even when the flexible substrate is transformed.

In accordance with another aspect of the present invention by arranging and stiffening a conductive paste in a predetermined pattern, it makes easy to form the conductive layer. Moreover, the conductive layer can be formed in low cost by a printing process.

In this arrangement since conductivity is satisfied, and it is possible to make the conductive layer having certain conductivity without losing the conductive layer's shape, because it is possible to stiffen it by heating concurrently with connection of the conductive line. The conductive layer as forming irregularly the surface of the conductive layer, a conductive contact area is broaden and adhesion force become strong.

In accordance with an additional aspect of the present invention, an anisotropic conductivity can be obtained, and as the conductive particles in the adhesive contacts the conductive layer, a large contact area and a large compression force are obtained, and durability of the contact area for the stress and heat from out side are improved.

As noted above, as the conductive layer consists of the same material with the conductive connection portion for connecting the electrode of the liquid crystal panel and the external terminal. This results in not increasing the number of manufacturing steps.

As the conductive layer is formed in a predetermined pattern on the external terminal at the same time of forming with and formed by the same material the conductive connection portion it is not necessary to add further steps of process, and the liquid crystal display device can be obtained easily and in low cost.

It is preferable for the upper surface of the conductive layer to be roughened or irregularly shaped. As a result of this feature, improvement of the adhesion force and an increase of the contact area can be achieved.

Wile conductive layer 7 is preferably formed in a predetermined pattern, one of ordinary skill in the art would appreciate that is could also be formed in a random pattern.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

Reference Symbols

1: Top substrate

2: Bottom substrate

2a: Electrode lead-out area

3,4: Electrodes which are transparent

3a,4a: External terminals

7: Conductive layer

7a: Upper surface

8: Conductive connection portion

10: FPC

12: Conductive lines

13: Anisotropic conductive film

13a: Adhesive

13b: Conductive particles

What is claimed is:

1. A liquid crystal display device having first and second substrates, a plurality of first electrodes arranged on the first substrate, and a plurality of second electrodes arranged on the second substrate, comprising:

an external portion arranged on the first substrate in electrical communication with the plurality of first electrodes;

a conductive layer comprising a first material and being arranged in a pattern on said external portion; and a conductive connection portion positioned between the first and second substrates and comprising the first material for electrically connecting the plurality of second electrodes to said external portion, the plurality of first and second electrodes being in electrical communication with a connection portion of a plurality of external wirings via said external portion.

2. A liquid crystal display device according to claim 1, wherein said external portion comprises a plurality of external terminals, and wherein said conductive layer is formed on a surface of said external terminals by arranging a stiffened conductive paste in a predetermined pattern.

3. A liquid crystal display device according to claim 2, wherein said conductive paste comprises a conductive ink and said conductive layer is formed by printing.

4. A liquid crystal display device according to claim 2, wherein said conductive paste comprises carbon particles and a phenol resin.

5. A liquid crystal display device according to claims 2, wherein an upper side of said conductive layer comprises a roughened surface.

6. A liquid crystal display device according to claim 2, further comprising an adhesive layer including a conductive particle in contact with said conductive layer, said adhesive layer being formed between said external terminal and the connection portion of the plurality of external wirings wherein the adhesive layer is disposed between the conductive layer and the external wirings.

7. A liquid crystal display device according to claim 1, wherein the external wirings comprise a flexible substrate.

8. A liquid crystal display device according to claim 1, wherein said conductive layer comprises a material comprising an electrically conductive connection portion for electrically connecting the plurality of electrodes with the external wirings.

9. A liquid crystal display device having a plurality of electrodes in electrical communication with a connection portion of a plurality of external wirings comprising:

an external portion in electrical communication with the plurality of electrodes;

a conductive layer formed in a pattern on a surface of said external portion; and an adhesive layer including a conductive particle in contact with said conductive layer, said adhesive layer being formed between said external portion and the connection portion of the plurality of external wirings, wherein the adhesive layer is disposed between the conductive layer and the external wirings.

10. A method of manufacturing a liquid crystal display device having a plurality of electrodes in electrical communication with a connection portion of a plurality of external wirings; said method comprising the steps of:

providing the first and second substrates;

forming an external portion in electrical communication with the plurality of electrodes;

forming a conductive layer comprising a first material arranged in a pattern on a surface of the external portion and sandwiching the conductive layer so that the conductive layer is in contact with the first and second substrates;

forming a conductive connection portion comprising the first material, positioned between first and second substrates and formed substantially simultaneously with the conductive layer;

removing a portion of the second substrate in an area which contacts the conductive layer, so that an upper surface of the conductive layer is formed having a roughened surface; and electrically connecting the connection portion to the external portion via the conductive layer.

11. A method of manufacturing a liquid crystal display device having a plurality of electrodes on first and second substrates in electrical communication with a connection portion of a plurality of external wirings, said method comprising the steps of:

forming an external portion on the first substrate in electrical communication with the plurality of electrodes;

forming a conductive layer in a pattern on a surface of the external portion;

forming a conductive connection portion positioned between the first and second substrates;

forming an adhesive layer, including a conductive particle in contact with the conductive layer, between the external portion and the connection portion of the plurality of external wirings, wherein the adhesive layer is disposed between the conductive layer and the external wirings; and electrically connecting the connection portion to the external portion via the conductive layer.

12. A method of manufacturing a liquid crystal display device having first and second substrates, a plurality of first electrodes being arranged on the first substrate and a plurality of second electrodes arranged on the second substrate, said method comprising the steps of:

forming an external portion on the first substrate in electrical communication with the plurality of first electrodes;

forming a conductive layer comprising a first material in a pattern on a surface of the external portion; and forming a conductive connection portion comprising the first material between the first and second substrates for electrically connecting the plurality of second electrodes to said external portion, wherein the plurality of first and second electrodes are in electrical communication with a connection portion of a plurality of external wirings via the external portion.

13. A method of manufacturing a liquid crystal display device having a plurality of electrodes in electrical communication with the connection portion of a plurality of external wirings, said method comprising the steps of:

providing first and second substrates;

forming an external portion on the first substrate in electrical communication with the plurality of electrodes;

forming a conductive layer in a pattern on a surface of the external portion and sandwiching the conductive layer so that the conductive layer is in contact with the first and second substrates;

removing a portion of the second substrate in an area which contacts the conductive layer, so that an upper surface of the conductive layer is formed having a roughened surface; and electrically connecting the connection portion to the external portion via the conductive layer.

* * * * *

UNITED STATES PATENT AND TRADEMARK OFFICE

CERTIFICATE OF CORRECTION

PATENT NO. : RE 38,053 E
DATED : April 1, 2003
INVENTOR(S) : Tatsuo Kanezawa

It is certified that error appears in the above-identified patent and that said Letters Patent is hereby corrected as shown below:

Title page,
Item [30], Foreign Application Priority Data, change "JP 7-004483" to
-- JP 7-004482 --.

Signed and Sealed this

Sixteenth Day of September, 2003

JAMES E. ROGAN
*Director of the United States Patent and Trademark Office*